US010914779B2

(12) United States Patent
Jakupi

(10) Patent No.: US 10,914,779 B2
(45) Date of Patent: Feb. 9, 2021

(54) ARC FAULT DETECTION USING TIME SEGMENTED CAPTURES

(71) Applicant: SCHNEIDER ELECTRIC USA, INC., Andover, MA (US)

(72) Inventor: Andi Jakupi, Marion, IA (US)

(73) Assignee: Schneider Electric USA, Inc., Andover, MA (US)

( * ) Notice: Subject to any disclaimer, the term of this patent is extended or adjusted under 35 U.S.C. 154(b) by 298 days.

(21) Appl. No.: 15/972,857

(22) Filed: May 7, 2018

(65) Prior Publication Data

US 2019/0339319 A1 Nov. 7, 2019

(51) Int. Cl.
*G01R 31/08* (2020.01)
*G06K 9/00* (2006.01)
*H02H 7/26* (2006.01)
*G01R 31/12* (2020.01)
*H02H 1/00* (2006.01)

(52) U.S. Cl.
CPC ....... *G01R 31/085* (2013.01); *G01R 31/1272* (2013.01); *G06K 9/00503* (2013.01); *G06K 9/00523* (2013.01); *G06K 9/00536* (2013.01); *H02H 1/0015* (2013.01); *H02H 7/26* (2013.01)

(58) Field of Classification Search
CPC .............. G01R 31/085; G01R 31/1272; G06K 9/00503; G06K 9/00523; G06K 9/00536; H02H 1/0015; H02H 7/26
See application file for complete search history.

(56) References Cited

U.S. PATENT DOCUMENTS

| 4,466,071 A | 8/1984 | Russell, Jr. |
| 6,980,407 B2 * | 12/2005 | Kawate ................ H02H 1/0015 361/42 |
| 7,062,388 B2 | 6/2006 | Rivers, Jr. et al. |
| 7,492,163 B2 | 2/2009 | Restrepo et al. |

(Continued)

FOREIGN PATENT DOCUMENTS

CA   2667883   5/2008

OTHER PUBLICATIONS

International Search Report and Written Opinion for related International Application No. PCT/US19/31008 dated Jul. 12, 2019.

*Primary Examiner* — Kyle J Moody
*Assistant Examiner* — Jye-June Lee
(74) *Attorney, Agent, or Firm* — Locke Lord LLP

(57) ABSTRACT

A detection method and system are provided to detect an arc fault signal in a (HF) high frequency signal monitored on a power line. The HF signal is monitored on the power line over a predefined time period such as a half-cycle of a base frequency, and is partitioned into a plurality of smaller time-segmented signal segments over the period. For each signal segment, a first filter is applied to a signal spectrum of the signal segment to produce a filtered signal spectrum having one or more frequency intervals associated with power line communication filtered from the signal spectrum. HF signal content is checked in the filtered signal spectrum, and a binary value is assigned to the signal segment based upon a presence or absence of HF signal content. Thereafter, an arc fault event is determined based on the accumulated binary values of the signal segments.

20 Claims, 13 Drawing Sheets

(56) References Cited

U.S. PATENT DOCUMENTS

| | | | |
|---|---|---|---|
| 2003/0074148 A1* | 4/2003 | Dvorak | H02H 1/0015 |
| | | | 702/58 |
| 2006/0050450 A1* | 3/2006 | Pellon | H02H 1/0015 |
| | | | 361/42 |
| 2006/0114627 A1* | 6/2006 | Wong | H02H 1/0015 |
| | | | 361/42 |
| 2008/0106832 A1* | 5/2008 | Restrepo | H02H 1/0015 |
| | | | 361/42 |
| 2011/0249370 A1 | 10/2011 | Nayak et al. | |
| 2014/0084942 A1 | 3/2014 | Logvinov et al. | |
| 2017/0343596 A1* | 11/2017 | Misumi | G01R 31/1272 |

\* cited by examiner

ARC FAULT DETECTION USING TIME SEGMENTED CAPTURES

FIELD

The present disclosure is related to a method and system for improving arc fault detection, and more particularly, to a method and system for improving interoperability of arc fault detection and power line communications (PLC) in a branch circuit.

BACKGROUND

Power line communication (PLC) devices can be used in buildings, such as a residential home (e.g., house, condominium, apartment, etc.), to enable data communications across a power system infrastructure, such as power lines of a branch circuit(s) or between different branches. PLC devices conduct communications in frequency ranges, such as for example in some given regulatory jurisdictions range from 1.8 MHz to 30 MHz and to as high as 86 MHz (see, e.g., HomePlug Avx and HomePlug GreenPhy). Power line communication protocol used by PLC devices can include, for example, IEEE 1901, IEEE P1901.2, HomePlug GP/AV/AV2/1.0, G.hn, or G.hnem. When PLC devices are employed in a building or other structure along with an arc fault circuit interrupter (AFCI) device, the presence of PLC signals, particularly the high frequency signal content of their carrier signals may be inadvertently interpreted by the AFCI device as arc fault signals, and thus, may result in nuisance trips by the AFCI device. Accordingly, PLC signals and other high frequency noises may interfere with arc fault detection at the high frequency ranges, e.g., frequency ranges greater than or equal to 1 MHz which can potentially mask any arcing signals.

One method to detect the presence of power line carriers is based on the Receive Signal Strength Indicator (RSSI) of high frequency signal content of power line carriers. However, the RSSI method does not appear to be robust due to the fact that RSSI does not contain frequency information, and therefore, any arc fault signal could look like a PLC signal or vice-a-versa from the signal strength point of view.

Another detection method involves selecting a frequency region (e.g., region, band, etc.) that corresponds to one of the notch bands of the power line carriers. The notch bands represent narrow frequency regions that are not enabled or used by the PLC device to conduct communication. However, such a detection method allows only a small window, e.g., the narrow frequency region, for the arcing signals to be detected. Furthermore, such a frequency region might be used by radio stations (e.g., amateur radio) or correspond to a network impedance (resonance/anti-resonance) point which could cause substantial sensitivity issues.

SUMMARY

To address these and other shortcomings, a detection method and system (hereinafter referred to simply as a "system" for brevity) are provided to detect an arc fault signal from a high frequency signal on a power line. In general, the system samples a high frequency signal from the power line over a predefined time period such as a half-cycle, and partitions the sampled high frequency signal into signal segments of smaller time intervals over the predefined time period. For example, the arc fault detection system partitions the monitored high frequency signal into a sequence of time-segmented signal segments, where N can equal a maximum number of signal segments for the high frequency signal within the predefined time period. The system filters out frequency regions known to carry power line communication (PLC) in each signal segment, and determines whether high frequency signal content, which may reflect an arc fault signal, is present or not in each filtered signal segment. In this way, a high frequency signal content distribution over the predefined time period can be obtained for the sampled high frequency signal in which PLC frequency regions have been filtered out in each signal segment. The system can then detect for a presence or absence of an arc fault signal based on the content distribution of the filtered signal segments over the predefined time period. For example, an arc fault signal is detected if the number of filtered signal segments having high frequency signal content within the predefined time period satisfies a threshold condition. When an arc fault signal is detected, power to the power line is interrupted.

The system can monitor and evaluate signals in the high frequency range on the power line, a range which is generally less noisy and less subject to noise injection from load(s) than the lower frequency ranges. The system also can discriminate common high frequency load noise and power line carriers in order to facilitate high frequency monitoring of arc fault signals on a power line.

In one aspect of the system, a high frequency signal is monitored on a power line over a first predefined time period (e.g., a half-cycle of a base frequency), and the high frequency signal is partitioned into a plurality of time-segmented signal segments of smaller time intervals over the predefined time period. For each signal segment, the system 1) applies a first filter to a signal spectrum of the signal segment to produce a first filtered signal spectrum with one or more frequency intervals associated with power line communication filtered from the signal spectrum, 2) checks for high frequency signal content in the first filtered signal spectrum of the signal segment, and 3) assigns a first binary value to the signal segment based upon a presence or absence of high frequency signal content in the first filtered signal spectrum. A signal spectrum is a representation of a signal, for example, in a frequency domain. Thereafter, a determination is made whether the high frequency signal includes an arc fault signal based on the first binary values of the plurality of signal segments in the first predefined time period. When an arc fault signal is detected, power is interrupted on the power line. The system can be implemented in a circuit breaker.

The first filter can be a mask (also referred to as a first mask), which is for example a pattern of bits used to accept or reject bit patterns in another set of data. The first mask can be applied to a data set of a signal spectrum, such as in the frequency domain, to compute a filtered signal spectrum which accepts or rejects the frequency intervals (or values thereof) associated with power line communication. The pattern of the mask can be represented in vector form, e.g., a mask vector.

In further example embodiments, the system, when assigning a first binary value for each signal segment, can be further configured to determine a relative magnitude of energy of the first filtered signal spectrum of the signal segment; to compare the relative magnitude of energy to a first spectrum energy threshold for determining a presence or absence of high frequency signal content in the signal segment; and to assign the first binary value to the signal segment based on the comparison. For example, a binary value of "1" can be assigned to a segment with a determined presence of high frequency signal content.

For each signal segment, the system can be further configured to apply a second filter (e.g., a second mask), which is an inverse of the first filter, to a signal spectrum of the signal segment in order to produce a second filtered signal spectrum having one or more frequency intervals associated with power line communication. The system can then check for high frequency signal content in the second filtered signal spectrum of the signal segment, and assign a second binary value to the signal segment based upon a presence or absence of high frequency signal content in the second filtered signal spectrum of the signal segment. The system can further adjust the first spectrum energy threshold based on the second binary values of the plurality of signal segments in the first period. The adjusted first spectrum energy threshold is used to evaluate high frequency signal on the power line in a time period after the first predefined time period.

When assigning a second binary value for each signal segment, the system can be configured to determine a relative magnitude of energy of the second filtered signal spectrum of the signal segment; to compare the relative magnitude of energy of the second filtered signal spectrum to a second spectrum energy threshold for determining a presence or absence of high frequency signal content in the signal segment; and to assign the second binary value to the signal segment based on the comparison. Based on the binary values, the arc fault detection sensitivity of the system can be dynamically adjusted to compensate for the presence or absence of PLC noise or other benign noise on the power line network, e.g., by adjusting the first spectrum energy threshold.

Furthermore, when determining whether the high frequency signal includes an arc fault signal, the system can be configured to count a number of times that high frequency signal content is present over the predefined time period based on the first binary values; to compare the number of times that high frequency signal content is present (in the first filtered signal spectrum of each signal segment) over the predefined time period to at least a first high frequency threshold; and to detect an arc fault signal when a condition for the first high frequency threshold is satisfied.

The first high frequency threshold can be associated with load on the power line (e.g., a load threshold), and a second high frequency threshold can be associated with arcing on the power line (e.g., an arc threshold). When determining whether the high frequency signal includes an arc fault signal, the system is further configured to compare the number of times that high frequency signal content is present (in the first filtered signal spectrum of each signal segment) over the predefined time period to the second high frequency threshold when the first high frequency threshold is satisfied. The system can detect an arc fault signal when both conditions for the first and second high frequency thresholds are satisfied.

Furthermore, the system can be configured to generate a binary word from a sequence of the first binary values for the signal segments from the first predefined time period. When the first high frequency threshold is not satisfied, the system can further evaluate the binary word to detect for an occurrence of an arc fault signal. For example, the binary word can be compared to one or more predefined word patterns to detect for an occurrence or non-occurrence of an arc fault signal in the high frequency signal. The predefined word patterns can correspond to known patterns for an arc fault event or non-arc fault event (e.g., a load event).

The predefined time period can be a half-cycle of a base frequency (e.g., 50 or 60 Hz of the power line frequency). A signal spectrum in the frequency domain can be generated for each signal segment using a Fourier Transform or a Cosine Transform, and all monitoring, partitioning, applying, checking, assigning and determining operations can be performed in a circuit breaker if desired.

DESCRIPTION OF THE FIGURES

The description of the various example embodiments is explained in conjunction with the appended drawings.

DISCUSSION OF EXAMPLE EMBODIMENTS

Figure 1:
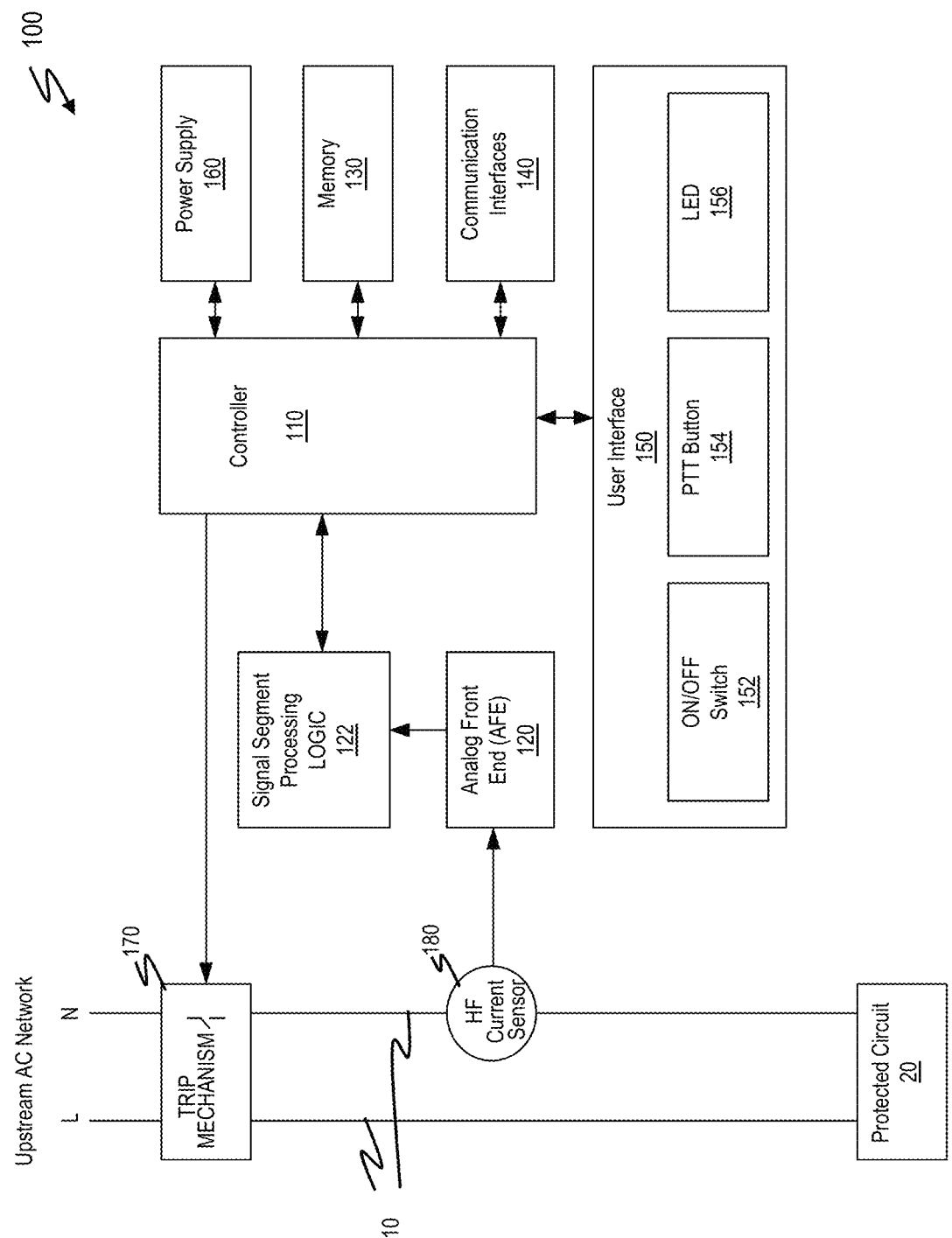
FIG. 1 illustrates a block diagram of a circuit breaker with an arc fault detection system for monitoring a high frequency signal on a power line and detecting arc fault signals by partitioning the high frequency signal monitored over a predefined period of time into smaller signal segments and evaluating the signal segments for high frequency signal content.

An arc fault detection method and system (again, hereinafter just "system") are provided, which monitor and analyze high frequency signals on a power line of a circuit to detect arc fault signals on the power line, even where high frequency components are generated on the power line by sources other than an arc fault, such as power line communication and other common radio frequency (RF) communication (e.g., amateur radio) in the high frequency range. In accordance with aspects of the present invention, the system is configured to partition a high frequency signal monitored on the power line over a predefined time period (e.g., a half-cycle of a base frequency) into a plurality of signal segments of smaller time within the predefined time period. The signal segments (e.g., sometimes called signal segment, interval, chip, etc.) are then evaluated for a presence of high frequency signal content in the frequency ranges or regions of interest. Because the frequency spectrum for power line communication and other common high frequency noise is known or can be ascertained beforehand, a filter (e.g., a mask) can be utilized to filter out the PLC operating frequency regions from a signal spectrum of each signal segment prior to their evaluation for high frequency content, e.g., potential arc fault signal content. For example, the mask can be applied to the spectrum of a signal segment to produce a filtered signal spectrum by ignoring carrier energy in benign frequency regions of the signal spectrum, e.g., intervals or bins for PLC carriers, when examining for the arc fault signal content.

Thereafter, the system can apply a binary classification to each signal segment to obtain a signal content distribution over the predefined time period. For example, the signal segments are each assigned a binary value, e.g., 0 or 1, which identifies a presence or absence of high frequency signal content of interest in a signal segment according to a relative magnitude of the energy of the filtered signal spectrum. The system can then detect a presence of arc fault signals on the power line based on the binary values for the signal segments over the predefined time period. For example, the system can determine an existence (or non-existence) of an arc fault signal in the high frequency signal when the binary values reflect a presence of potential arc fault signal content in a significant number of the signal segments or a particular pattern of binary values (e.g., a particular binary word) over the predefined time period. When an arc fault signal is detected, power on the power line can be interrupted by tripping a trip mechanism (e.g., a switch, etc.) of a circuit breaker.

Accordingly, the system herein can perform arc fault detection in a high frequency region (e.g., greater than 1 MHz, or between 1 MHz and 100 MHz) which generally contains less load noise than lower frequency regions on a power line, while reducing the possibility of nuisance arc fault detection and trips that may result from PLC communication or other common high frequency noise. The system can also be implemented in a circuit breaker or in combination with a circuit breaker in an efficient and cost effective fashion. Examples of these and other features of the system will be described below with reference to the examples in FIGS. 1-13.

FIG. 1 illustrates a block diagram of a circuit breaker 100 with an arc fault detection system for monitoring high frequency signal on an AC power line 10 (e.g., with a base frequency of 50 or 60 Hz power line) of a protected circuit 20. The circuit breaker 100 includes a controller 110, an analog front end (AFE) 120 to receive signals from a high frequency (HF) current sensor 180, a signal segment processing logic 122, a memory 130, communication interfaces 140 to communicate with remote devices over a communication medium, a user interface 150, a power supply 160 to power the components of the circuit breaker 100, and a trip mechanism 170 to interrupt power on the power line 10 upstream of the protected circuit 20. The user interface 150 can include an ON/OFF switch 152 (e.g., a handle), a push-to-test (PTT) button to test the circuit breaker, and one or more LEDs 156 or other indicators for indicating a status of the circuit breaker (e.g., ON, OFF, RESET, TRIPPED, etc.) or other circuit breaker information. The HF current sensor 180 can be a high frequency current sensor such as a Rogowski coil or other sensor to measure high frequency signals on the power line.

In the circuit breaker 100, the analog front end 120, the signal segment processing logic 122, the controller 110 and memory 130 can operate together to provide an arc fault detection system, which is configured to detect arc fault signals in a high frequency range on the power line 10. The analog front end 120 is configured to receive and monitor high frequency signals in desired high frequency region(s) from the HF current sensor 180, and can be a radio frequency (RF) receiver that includes a bandpass filter(s).

The operations of the signal segment processing logic 122 can be implemented in an ASIC or FPGA or other dedicated signal processing module. The signal segment processing logic 122 operates to partition the high frequency signal, received through the analog front end 120 over a predefined time period (e.g., a half-cycle of a base frequency), into a plurality of time-segmented signal segments of smaller time intervals, and to detect a presence or absence of high frequency signal content in frequency regions of interest in each signal segment.

For example, in general, the signal segment processing logic 122 can generate a signal spectrum for each signal segment, and then implement two parallel sub-processes on the signal spectrum to detect for two different types of signal content in each signal segment. As discussed herein, a signal spectrum is a representation of the signal in a desired domain (e.g., frequency domain). One sub-process, referred to herein as "ARC" sub-process, is used to detect for potential arc fault frequency signal components in each signal segment in order to detect for a presence or absence of an arc fault signal on a power line. The other sub-process, referred to herein as "HF" sub-process, is used to detect for a PLC frequency signal component (and other benign noise if desired) in each signal segment in order to dynamically adjust a sensitivity level of the detection for arc fault signal components performed by the ARC sub-process (e.g., by adjusting a spectrum energy threshold ($th_a$)) in view of a noise level on the power line network. For instance, in operation, the signal segment processing logic 122 can output an ARC binary value via the ARC sub-process to reflect a presence or absence of potential arc fault signal component for each signal segment, and can output a HF binary value via the HF sub-process to reflect a presence or absence of a PLC frequency signal component or other benign noise. The signal segment processing logic 122 can also output an accumulated value of all of the binary values for each sub-process over the predefined time period, e.g., ARC accumulation and HF accumulation. For the purposes of explanation, the terms ARC and HF are simply used in some instances herein as an adjective to describe the processes or data associated with the respective sub-processes. Example operations of the signal segment processing logic 122, including their sub-processes, are described in greater detail below with reference to FIGS. 3 through 8.

The controller 110 is configured to receive the binary value(s), accumulation of the binary values for the ARC and HF sub-processes, or data associated therewith for each signal segment, to detect a presence or absence of an arc fault signal in the monitored high frequency signal based on the ARC binary values, and to adjust a signal spectrum threshold applied by the ARC sub-process of the signal segment processing logic 112. The controller 110 is also configured to initiate a circuit breaker trip operation, which interrupts power on the power line 10 via the trip mechanism 170 under certain conditions, including when the presence of an arc fault signal is detected. The controller is also configured to control other operations of the circuit breaker 100 including communication via the communication interfaces 140 (e.g., to receive or transmit commands or status information/reports), to perform operations based on actions input by a user through the user interface 150, to output a status of the circuit breaker such as via the LED 156 or other output device, and to perform other operations of the circuit breaker related to arc fault detection and power interruption. Example operations of the controller 110 are described in greater detail below with reference to FIGS. 9 through 11.

The memory 130 can store computer executable code or programs or software, which when executed by the controller 110, controls the operations of the circuit breaker 100 including the arc fault detection operations and other circuit breaker operations such as circuit interruption. The memory 130 can also store other data used by the circuit breaker 100 or components thereof to perform the operations described herein. The other data can include but is not limited to thresholds, filters/masks, threshold hysteresis, other circuit breaker data, and other data discussed herein.

Figure 2:
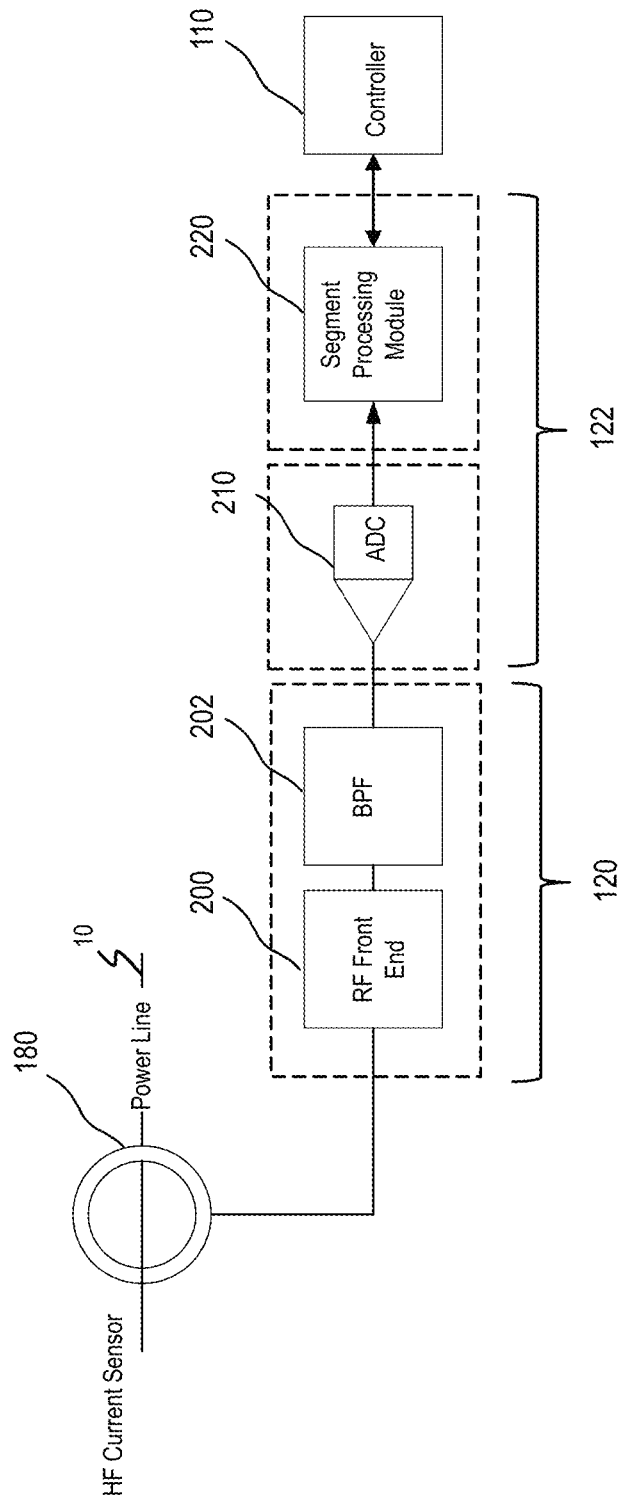
FIG. 2 illustrates a block diagram of the components of an analog front end and a signal segment processing logic of the arc fault detection system of FIG. 1.

FIG. 2 illustrates a block diagram of the components of the analog front end 120 and the signal segment processing logic 122 of the arc fault detection system of FIG. 1, in accordance with an example embodiment of the present disclosure. The analog front end 120 can include a radio frequency (RF) front end 200, such as an RF receiver, and a bandpass filter 202, which together perform signal conditioning and narrow the frequency range of the signal received by the RF front end 200 from the HF current sensor 180.

The signal segment processing logic 122 can include an analog-to-digital converter (ADC) 210 to convert the analog signal from the analog front end 120 to a digital signal for signal segment processing by a segment processing module 220. The ADC 210 can, for example, have a sampling rate at a Nyquist rate of the maximum frequency range (e.g., twice 100 MHz). For example, at 100 MHz, these signals are not attenuated significantly, and thus, they can be detected with a HF current sensor or the like. On the sampling side, the Nyquist sampling rate can be at least 200 MHz to observe content on the 100 MHz signals. The limit of 100 MHz is an arbitrary maximum limit. The arc fault detection system herein can operate with 30 MHz to detect most of PLC AV1 and Green PHY carriers, and with 100 MHz to detect AV2.0.

The segment processing module 220 can be configured to perform the various signal processing functions and features of the signal segment processing logic 122, as described herein. The controller 110 receives the output from the signal segment processing logic 122, e.g., ARC binary values and/or HF binary values for the signal segments of the monitored high frequency signal on the power line 10.

Figure 3:
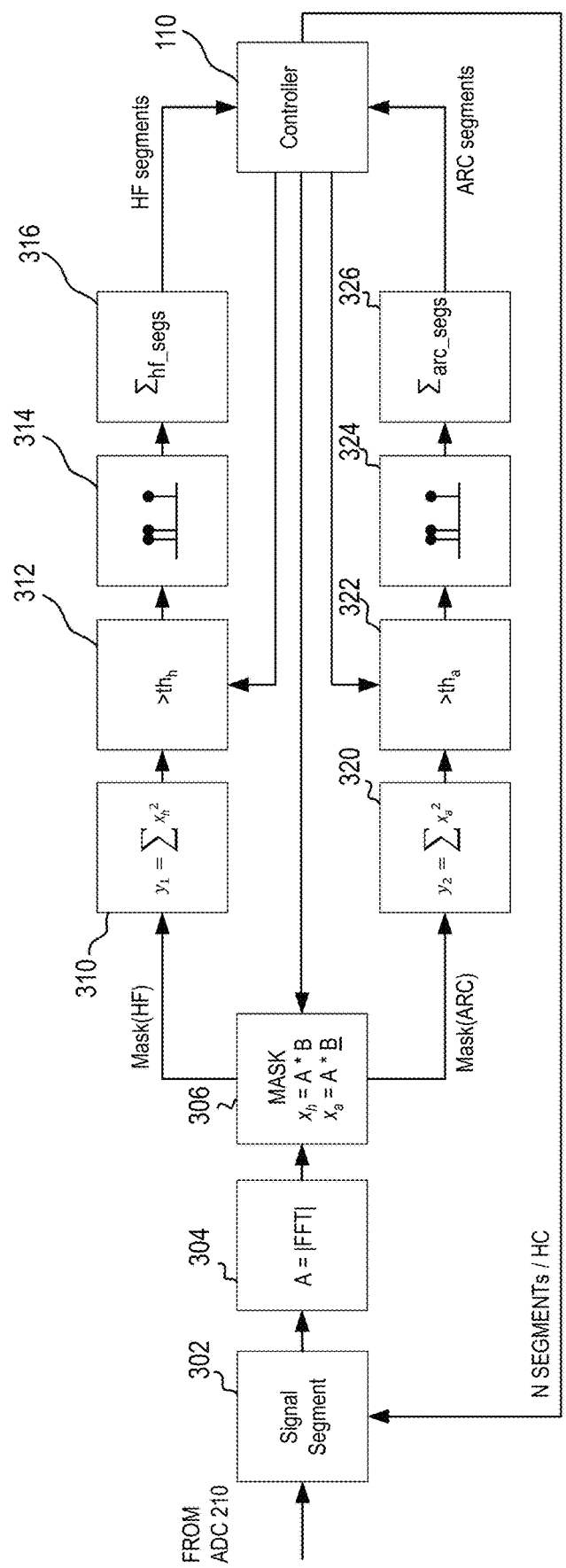
FIG. 3 illustrates a functional block diagram of the components of a signal segment processing logic of the arc fault detection system, such as in FIGS. 1 and 2, which perform signal segment processing of high frequency signals.

FIG. 3 illustrates a functional block diagram of the components of a signal segment processing logic 122 of the arc fault detection system, such as in FIGS. 1 and 2, which obtains and performs signal segment processing on each signal segment of a high frequency signal monitored over a predefined time period (e.g., a half-cycle of the base frequency of the power transmission), in accordance with an example embodiment of the present disclosure.

At block 302, a signal segment is obtained (e.g., from ADC 210 in FIG. 2). At block 304, a signal spectrum is generated for each signal segment. In this example, the signal segment is processed using a Fast Fourier Transform, e.g., an FFT module, which computes a magnitude of the signal spectrum for the signal segment. At block 306, two separate masks, a HF mask and an ARC mask, are applied to the signal spectrum of the signal segment to produce respective filtered signal spectrums, which are to be processed in parallel. The ARC mask is used in the ARC sub-process to generate an ARC filtered signal spectrum (e.g., $x_a$) of the signal segment without or ignoring the frequency regions associated with power line communication. The HF mask is used in the HF sub-process to generate a HF filtered signal spectrum of the signal segment having the frequency regions associated with power line communication.

In an arc fault detection sub-process (also referred to as the ARC sub-process), the ARC filtered signal spectrum is subsequently processed to determine a relative magnitude of the energy of the ARC filtered signal spectrum. For example, at block 320, a sum of the square of the magnitude (e.g., $y_2 = \Sigma x^2$) of the ARC filtered signal spectrum is computed and used as the relative magnitude for the filtered signal spectrum of the signal segment. Alternatively, the ARC filtered signal spectrum can be provided to an auto-correlator (ACR) to determine a maximum peak of the magnitude, which can instead be used as the relative magnitude. The ACR can compute the energy which is equivalent to the summation of squares of the samples, e.g., computing the energy of the signal spectrum vector after the mask is applied. At block 322, the relative magnitude is compared against a spectrum energy threshold, e.g., $th_a$ (see FIG. 9) to determine a presence or absence of high frequency signal content in the ARC filtered signal spectrum. At block, 324, the ARC filtered signal spectrum is converted to a binary value to reflect the presence or absence of high frequency signal content therein, e.g., in this case, potential arc fault signal components. For example, the ARC filtered signal spectrum is assigned a binary value of "1" when the relative magnitude reflects the presence of high frequency signal content in the ARC filtered signal spectrum, and is assigned a binary value of "0" when the relative magnitude reflects the absence of high frequency signal content in the ARC filtered signal spectrum, or vice-a-versa. The above-noted blocks 320, 322 and 324 are repeated for the entire number of signal segments (e.g., N) allocated within the predefined time period (e.g., a half-cycle of the base frequency).

At block 326, the collection of binary value outputs is fed to an ARC summation module (e.g., $\Sigma_{arc\_segs}$) which can convert the data to a format available to the controller 110, such as for example a byte which is sufficient to represent up to a maximum signal segment number (N) equal to 50. The ARC summation module can accumulate the number of times high frequency signal content is present or absent (e.g., SEG_ACC) and pass along to the controller 110 the accumulated value and/or a binary word formed by a sequence of the binary values for the signal segments within the predefined time period (e.g., half cycle). The controller 110 evaluates the data representative of the binary values, detects whether an arc fault signal is present or absent in the high frequency signal monitored over the predefined time period based on the binary values, and interrupts or causes the interruption of power on the power line via a trip mechanism when the presence of an arc fault signal is detected.

As further shown in FIG. 3, a parallel operation is performed on the HF filtered signal spectrum (e.g., $x_p$) for each signal segment within the predefined time period to determine a noise level on the power line network, which is used to adjust the detection sensitivity (e.g., adjust the threshold $th_a$) of the ARC sub-process based on the noise level. For example, at block 310, a sum of the square of the magnitude (e.g., $y=\Sigma x^2$) of the HF filtered signal spectrum is computed and used as the relative magnitude for the filtered signal spectrum energy. Alternatively, the HF filtered signal spectrum can be provided to an auto-correlator (ACR) to determine a maximum peak of the magnitude, which can instead be used as the relative magnitude. At block 312, the relative magnitude is compared against a spectrum energy threshold (e.g., $th_h$) to determine a presence or absence of high frequency signal content in the HF filtered signal spectrum. At block 314, the HF filtered signal spectrum is converted to a binary value to reflect the presence or absence of high frequency signal content therein, e.g., in this case, PLC carriers. For example, the HF filtered signal spectrum can be assigned a binary value of "1" when the relative magnitude reflects the presence of high frequency signal content in the HF filtered signal spectrum, and can be assigned a binary value of "0" when the relative magnitude reflects the absence of high frequency signal content in the HF filtered signal spectrum, or vice-a-versa. The above-noted blocks 310, 312 and 314 are repeated for the entire number of signal segments (e.g., N) allocated within the predefined time period (e.g., a half-cycle of the base frequency).

At block 316, the collection of binary value outputs is fed to a HF summation module (e.g., $\Sigma_{hf\_segs}$) which can convert the data to a format available to the controller 110, such as for example a byte which is sufficient to represent up to a maximum signal segment number (N), e.g., 50. The HF summation module can accumulate a number of times high frequency signal content is present or absent (e.g., HF_ACC) and pass along to the controller 110 the accumulated value and/or a binary word formed by a sequence of the binary values for the signal segments within the predefined time period. The controller 110 evaluates the data representative of the binary values (e.g., binary word and/or HF_ACC) to determine a presence or absence of PLC or other benign noise on the power line network, and can adjust the spectrum energy threshold (e.g., $th_a$) accordingly, which is used in the ARC sub-process to evaluate the ARC filtered signal spectrum.

When the predefined time period is for example a half-cycle of the base frequency, a signal segment count N can be selected as 50 (e.g., for 50 Hz and N=50 corresponds to 200 µS set of signal segments). The number and time interval of each signal segment can be configured to detect and discriminate the smallest PLC signal burst. For example, if one of these PLC signal bursts is split in half between two signal segment acquisitions, then at least one signal segment will likely enable detection of a high frequency component if present in the high frequency signal within the time interval of the two signal segments. The number N can be determined based on the sampling rate, the memory and the number of points an FFT module or the like can process. For example, if a 1024 point FFT is used, then it is possible to have up to 2048 samples. Further, for a sampling rate of 50 Msps, and half-cycle period of 8.33 ms, then N=203 (e.g., 50 Msps->20 ns per sample, 20 ns/s*2048=41 us/segment, thus N=8.33 ms/41 us~203 segments). The example with N=50 is simply illustrative.

The spectrum energy threshold $th_h$, which is used to check for HF energy and other known RF noise in the HF sub-process, can be determined theoretically, given that the power spectral density for the PLC is generally known (e.g., for one region such as North America with normalized power of −50 dBm/Hz). Other factors can be considered in the determination of the threshold $th_h$, such as for example the AGC (Automatic Gain Control), BPF (Band Pass Filter), ADC ENOB (Effective Number of Bits), sampling rate, the number of bins or intervals for the signal transform module (e.g., FFT module) to compute this threshold, and so forth. The spectrum energy threshold $th_a$, which is used to check for arc energy, can be determined empirically through experimentation, and can also be adjusted to account for noise from the arc fault detection system and components thereof and the noise on the power line network.

Figure 4:
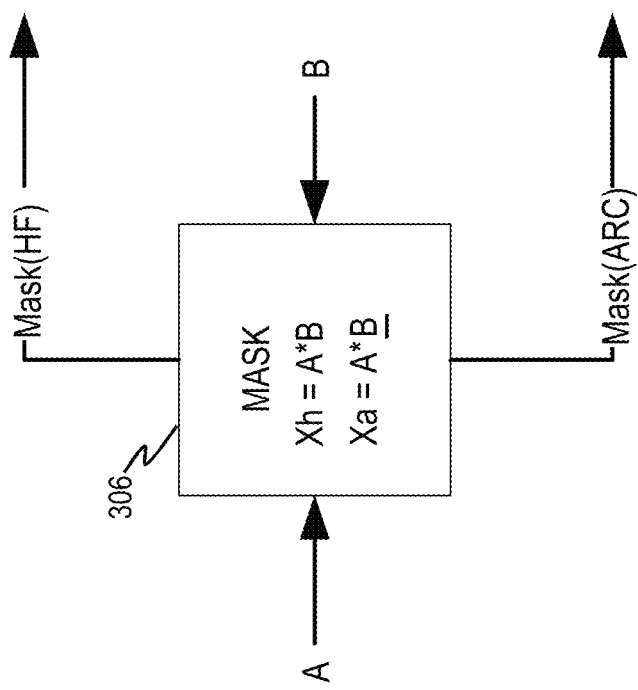
FIG. 4 illustrates an expanded view of a masking functional block of the arc fault detection system, such as in FIG. 3.
Figure 5:
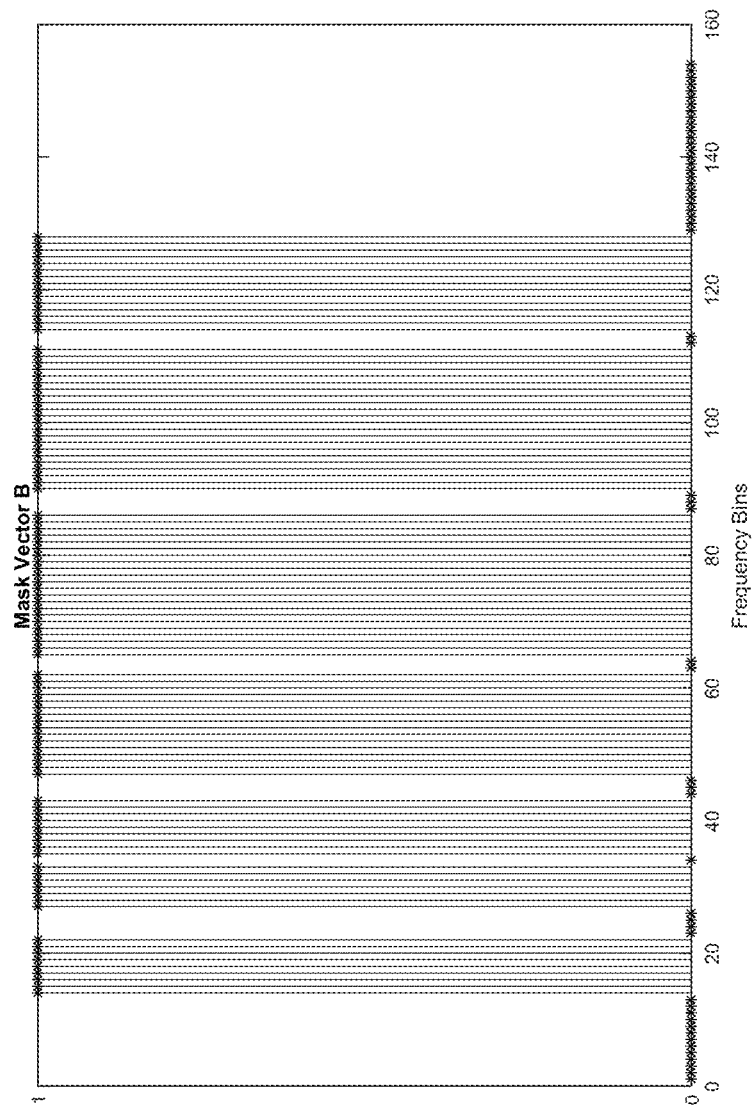
FIG. 5 illustrates an example of a mask vector.

FIG. 4 illustrates an expanded view of a masking functional block 306 of the arc fault detection system, such as in FIG. 3, in accordance with an example embodiment of the present disclosure. As shown in FIG. 4, at block 306, a masking module receives data of a signal spectrum (e.g., A), such as generated using a Fourier Transform or Cosine Transform, for each signal segment within the predefined time period. The masking module receives a HF mask (e.g., B) and applies the HF mask to the signal spectrum to produce a HF filtered signal spectrum for the signal segment, and is referred to as Mask(HF). An example of the mask B is shown in FIG. 5. The HF mask is used to generate a filtered signal spectrum of the signal segment having the frequency regions associated with power line communication. The masking module also applies an ARC mask (e.g., $\overline{B}$), which is the inverse of the HF mask (e.g., B), to produce an ARC filtered signal spectrum for the signal segment, and is referred to as Mask(ARC). The ARC mask is used to generate a filtered signal spectrum of the signal segment without the frequency regions associated with power line communication.

Figure 6:
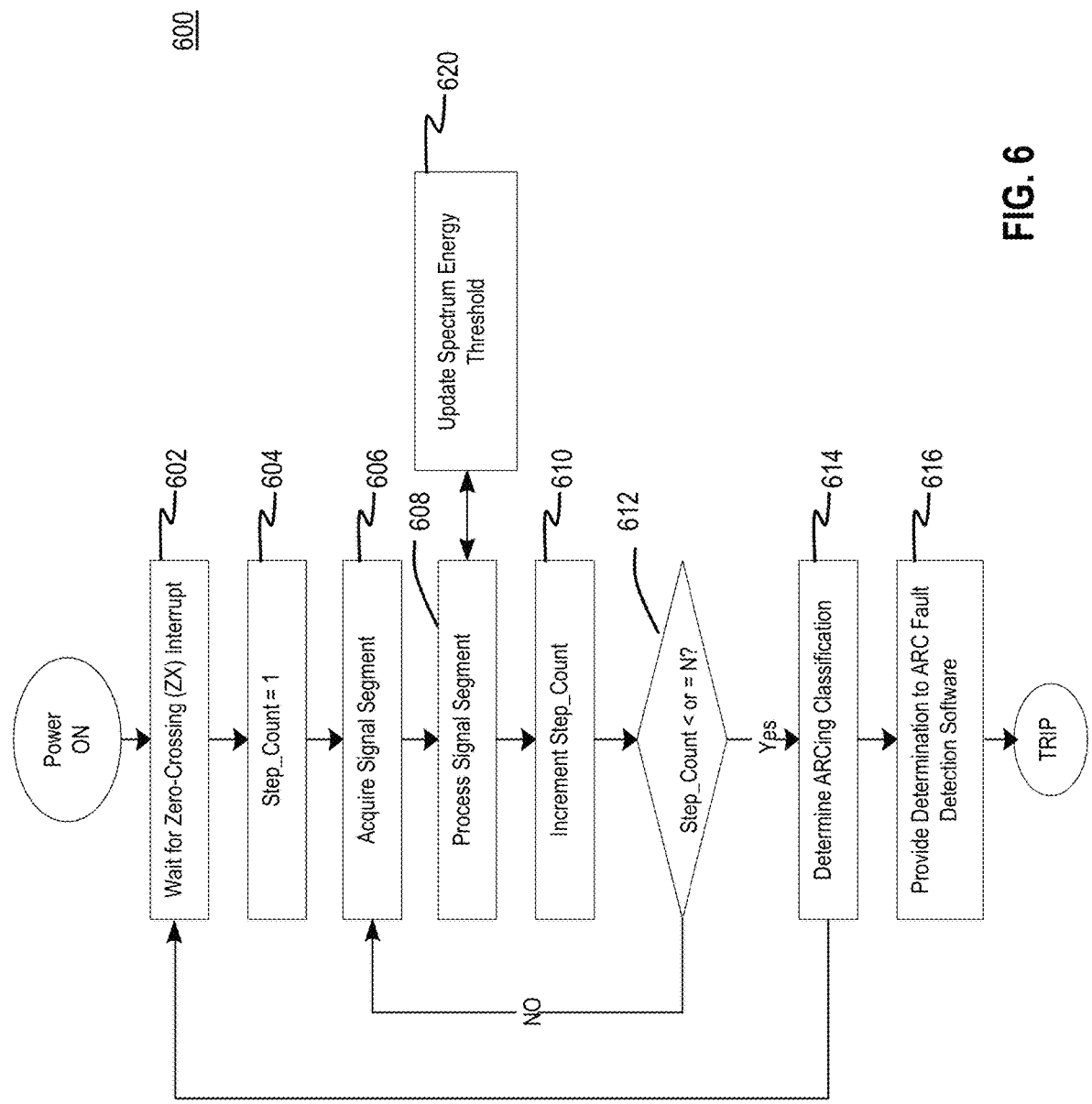
FIG. 6 illustrates a flow diagram of an example process implemented by the arc fault detection system, such as in FIG. 1, by which an arc fault signal is detected from the high frequency signal monitored on a power line.

FIG. 6 illustrates a flow diagram of an example process 600 implemented by one or more signal processing components of the arc fault detection system, such as in FIG. 1, by which an arc fault signal is detected from high frequency signals monitored on a power line. As will be described below, in the process 600, the arc fault detection system partitions the monitored high frequency signal into a plurality of time-segmented signal segments, and evaluates each signal segment in order to detect for arc fault signals on the power line. The number N can equal a maximum number of signal segments for the high frequency signal within the predefined time period.

The process 600 begins when power on the monitored power line is ON. At step 602, the arc fault detection system waits for zero-crossing (ZX) interrupt. At step 604, the arc fault detection system sets the counter (e.g., Step_Count) equal to 1. At step 606, the arc fault detection system acquires a signal segment, which is a smaller interval of a high frequency signal that is monitored on the power line over a predefined time period (e.g., a half-cycle of a base frequency).

At block 608, the arc fault detection system processes the signal segment. For example, as described herein, each signal segment is processed by generating a signal spectrum, applying a mask to produce a filtered signal spectrum, determining a relative magnitude of energy of the filtered signal spectrum, comparing the relative magnitude to a spectrum energy threshold, and assigning a binary value based on the comparison to reflect a presence or absence of high frequency signal content of interest in the signal segment. The signal segment processing can be implemented to detect a presence of potential arc fault signal content and/or PLC signal content in a signal segment. At block 620, the spectrum energy threshold for the ARC sub-process can be adjusted by the arc fault detection system based on a triggering event or other conditions (e.g., HF sub-process), such as for example described herein.

At block 610, after the signal segment is processed, the arc fault detection system increments the counter (e.g., Step_Count). At block 612, the arc fault detection system compares the counter to a maximum number N. If the counter is less than N, then the process 600 returns to block 606 and acquires the next signal segment within the predefined time period, and implements the blocks 608, 610 and 612 in relations to the next signal segment. Otherwise, if the counter is equal to N, then the arc fault detection system determines an ARCing classification, e.g., a presence or absence of an arc fault signal in the monitored high frequency signal, based on the information accumulated from the signal segments of the monitored high frequency signal within the predefined time period. At block 616, the determined classification is provided to an arc fault detection software within a circuit breaker (e.g. 100), which initiates a trip operation (e.g., TRIP) to interrupt power on the power line (e.g., 10) when an arc fault signal is detected.

Figure 7:
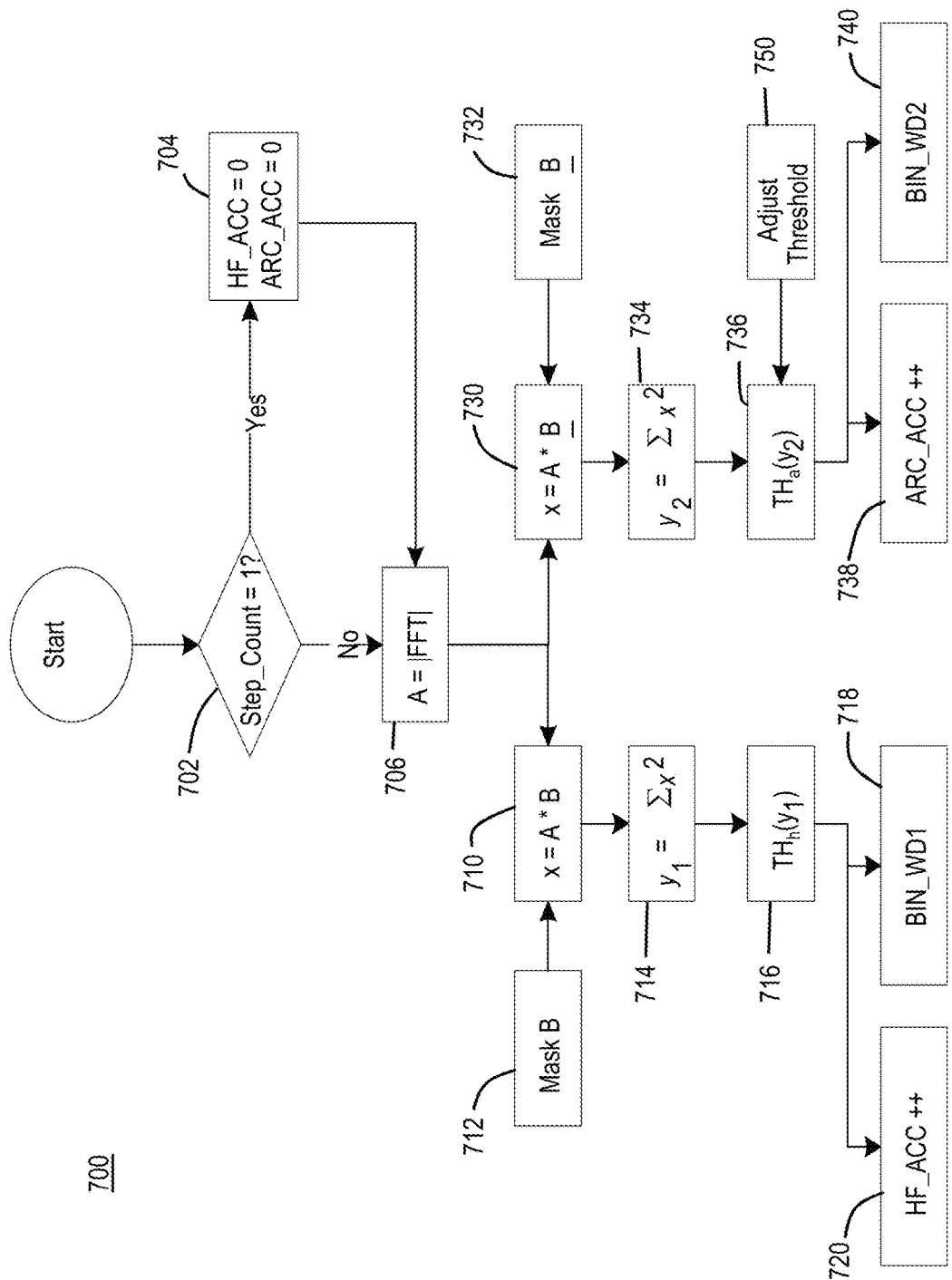
FIG. 7 illustrates a flow diagram of an example process implemented by the arc fault detection system, such as in FIG. 1, by which signal segment processing, such as in the example process of FIG. 6.

FIG. 7 illustrates a flow diagram of an example process 700 implemented by one or more signal processing components of the arc fault detection system, such as in FIG. 1, by which signal segment processing (e.g., 508), such as in the example process of FIG. 6, is performed. The process 700 is an example implementation of the ARC sub-process and HF sub-process performed on each signal segment in a predefined time period.

The process 700 begins at step 702, in which the arc fault detection system checks whether the counter (e.g., Step_Count) is equal to 1 for a predefined time period. If the counter is equal to 1, the prior accumulation value(s) 720, 738 (e.g., HF_ACC and SEG_ACC) for a prior time period is reset to zero. Otherwise, the process 700 proceeds to step 706 in which the arc fault detection system generates a signal spectrum for the signal segment to be processed. The signal spectrum can be computed using a Fourier Transform or a Cosine Transform or any suitable signal transform to determine a frequency spectrum of the RF signal segment. In this example, once the signal spectrum, e.g., "A", is generated for the signal segment, two parallel sub-processes can be implemented. For example, the HF sub-process is used to detect for PLC frequency signal component and other high frequency components of interest (e.g., steps 710, 712, 714, 716, 718 and 720), and the ARC sub-process is used to detect for potential arc frequency signal component (e.g., steps 730, 732, 734, 736, 738 and 740).

Regarding the HF sub-process for HF detection, at steps 710 and 712, the arc fault detection system retrieves a HF mask (e.g., B), and applies the HF mask to the signal spectrum A to produce a filtered signal spectrum. An example of the HF mask is shown in FIG. 5. At step 714, a sum of the square of the magnitude (e.g., $y_1 = \Sigma x_h^2$) of the HF filtered signal spectrum is computed and used as the relative magnitude for the filtered signal spectrum. Alternatively, the HF filtered signal spectrum can be provided to an ACR to determine a maximum peak of the magnitude, which can instead be used as the relative magnitude. At step 716, the relative magnitude is compared against a spectrum energy threshold (e.g., $th_h$) to determine a presence or absence of high frequency signal content in the HF filtered signal spectrum. The HF filtered signal spectrum is then converted to a binary value to reflect the presence or absence of high frequency signal content therein. For example, the HF filtered signal spectrum can be assigned a binary value of "1" when the relative magnitude reflects the presence of high frequency signal content in the HF filtered signal spectrum, and can be assigned a binary value of "0" when the relative magnitude reflects the absence of high frequency signal content in the HF filtered signal spectrum, or vice-a-versa. At steps 718 and 720, the arc fault detection system can generate a binary word (e.g., BIN_WD1) reflecting a sequence of the binary values for each signal segment, and can also accumulate a number of times high frequency signal content is present or absent (e.g., HF_ACC) in the predefined time period. The binary word and accumulation value can then be used to adjust a spectrum energy threshold (e.g., $th_a$) to be used in future ARC sub-processing.

Regarding the ARC sub-process for arc fault detection, at steps 730 and 732, the arc fault detection system retrieves an ARC mask (e.g., $\underline{B}$ which is the inverse of mask B), and applies the ARC mask to the signal spectrum A to produce a filtered signal spectrum. At step 734, a sum of the square of the magnitude (e.g., $y_2 = \Sigma x_a^2$) of the ARC filtered signal spectrum is computed and used as the relative magnitude for the filtered signal spectrum. Alternatively, the ARC filtered signal spectrum can be provided to an ACR to determine a maximum peak of the magnitude, which can instead be used as the relative magnitude. At step 736, the relative magnitude is compared against a spectrum energy threshold (e.g., $th_a$) to determine a presence or absence of high frequency signal content, e.g., potential arc fault signal content, in the ARC filtered signal spectrum. The ARC filtered signal spectrum is then converted to a binary value to reflect the presence or absence of high frequency signal content therein, e.g., "1" when the relative magnitude reflects the presence of high frequency signal content in the ARC filtered signal spectrum, and "0" when the relative magnitude reflects the absence of high frequency signal content in the ARC filtered signal spectrum, or vice-a-versa. At steps 738 and 740, the arc fault detection system can generate a binary word (e.g., BIN_WD2) reflecting a sequence of the binary values for each signal segment, and can also accumulate a number of times high frequency signal content is present or absent (e.g., SEG_ACC) within the predefined time period. The binary word and accumulation value can then be used to detect for a presence or absence of an arc fault signal in the high frequency signal monitored over the predefined time period.

Figure 8:
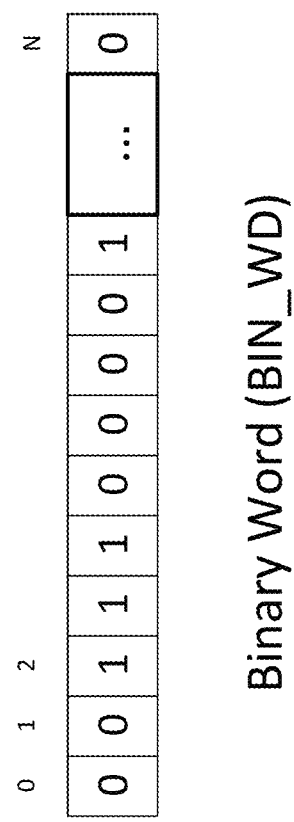
FIG. 8 illustrates an example binary word generated for a high frequency signal monitored over a period of time (e.g., a half-cycle of a base frequency), such as by the process of FIG. 7.

FIG. 8 illustrates an example format of a binary word 800 generated for a high frequency signal, which is monitored over a predefined period of time, such as by the process of FIG. 7, in accordance with an example embodiment of the present disclosure. In this example, N represents the number of signal segments of a high frequency signal monitored over a predefined time period. As shown in FIG. 8, the binary word 800 is a sequence of binary values of N-partitioned signal segments of a monitored high frequency signal on a power line. As described herein, the binary values in the binary word 800 can represent a presence or absence of high frequency signal content of interest (e.g., PLC or arc fault signal component) for the N-signal segments.

Figure 9:
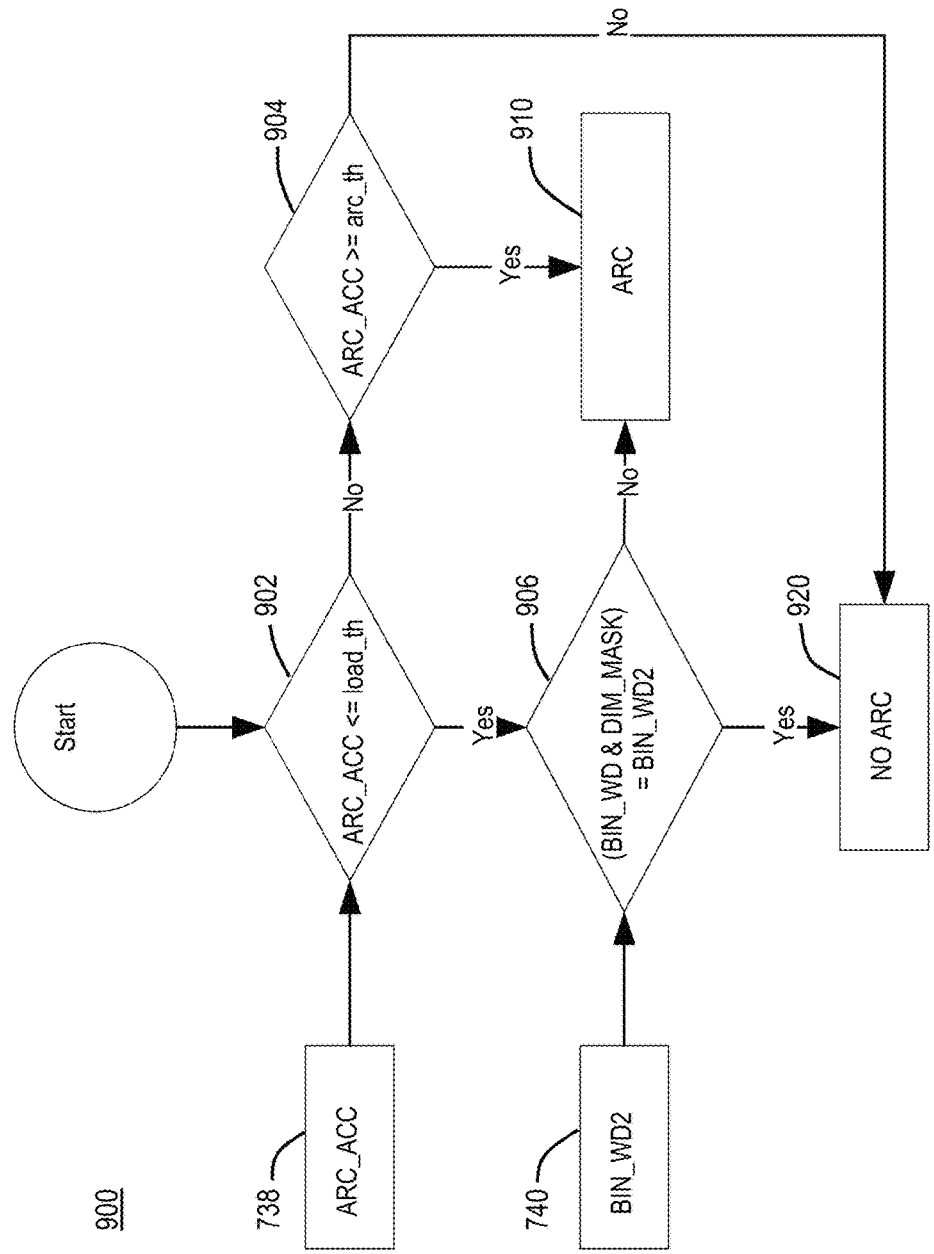
FIG. 9 illustrates a flow diagram of an example process implemented by the arc fault detection system, such as in FIG. 1, to classify a monitored high frequency signal as containing an arc fault signal or non-arc fault signal.

FIG. 9 illustrates a flow diagram of an example process 900 implemented by one or more processing components of the arc fault detection system, such as in FIG. 1, to classify a high frequency signal as containing an arc fault signal or non-arc fault signal, in accordance with an example embodiment of the present disclosure. In the process 900, a load threshold (, e.g., load_th) and an arc threshold (, e.g., arc_th) are used to determine a presence of a benign signal associated with a load or an arc fault signal.

At step 902, the arc fault detection system compares the arc binary accumulation, e.g., SEG_ACC from the ARC sub-process, in which high frequency signal content was detected in the signal segments (e.g., step 738 of FIG. 7) to the load threshold. If the arc binary accumulation is greater than the load threshold, then at step 904 the arc fault detection system compares the arc binary accumulation to the arc threshold. If the arc binary accumulation is greater than or equal to the arc threshold, then the arc fault detection system detects a presence of an arc fault signal at step 910. Otherwise, if the arc binary accumulation is less than the arc threshold, then the arc fault detection system detects an absence of an arc fault signal at step 920.

If the arc binary accumulation is less than or equal to the load threshold, then at step 906 the arc fault detection system compares the binary word, e.g., BIN_WD2, reflecting a presence or absence of high frequency signal content in the signal segments of the high frequency signal (e.g., step 740 of FIG. 7) to one or more predetermined binary word(s) or an event mask(s) (e.g., DIM_MASK reflecting a dimmer event). The predetermined binary words, or event masks represent patterns reflecting known arc fault events or non-arc fault events. In this example, if the binary word BIN_WD2 does not match predetermined binary words and/or masks representing non-arc fault events, then the arc fault detection system detects a presence of an arc fault signal at step 910. Otherwise, if the binary word BIN_WD2 matches the predetermined binary words and/or masks representing non-arc fault events, then the arc fault detection system detects an absence of an arc fault signal at step 920.

The above process 900 is simply provided as an example. Various predefined binary patterns, either reflected in a predefined binary word or mask, representing a presence or absence of an arc fault event can also be evaluated at step 806 to determine an occurrence or not of an arc fault event. The predefined binary patterns can be determined from empirical data, and the arc fault detection system can be updated to add, modify or remove predetermined patterns, such as from a remote management device which can communicate with the arc fault detection system, such as in the circuit breaker of FIG. 1.

As reflected in the process 900, there may be situations in which the load on the power line may inadvertently result in a detection of a potential (nuisance) arc fault signal in a signal segment, such as for example due to an operation of a dimmer. For example, with some dimmers, when they open up during a half-cycle, the fast switch ON may appear as a pulse having a frequency response in a narrow high frequency range (e.g., MHz). As a result, this operation may be observed in the signal spectrum and may be classified as a potential arc fault signal component (e.g., classified with a binary value of "1"). Accordingly, the load and arc thresholds and predetermined patterns (e.g., predetermined binary word and/or mask) can be configured accordingly, to avoid inadvertent arc fault detection due to non-arc fault events. For example, the dimmer mask (DIM_MASK), which represents a non-arc fault event, can contain potential dimmer positions or some unique load switching. Thus, these known load events can be represented by a predetermined pattern, e.g., the location of certain binary values in certain locations in the binary word. In one example embodiment, the load and arc thresholds can, for example, be greater than 2, to taken into account the possibility that high frequency signal content in a signal segment may be due to known load events, such as a dimmer event.

Figure 10:
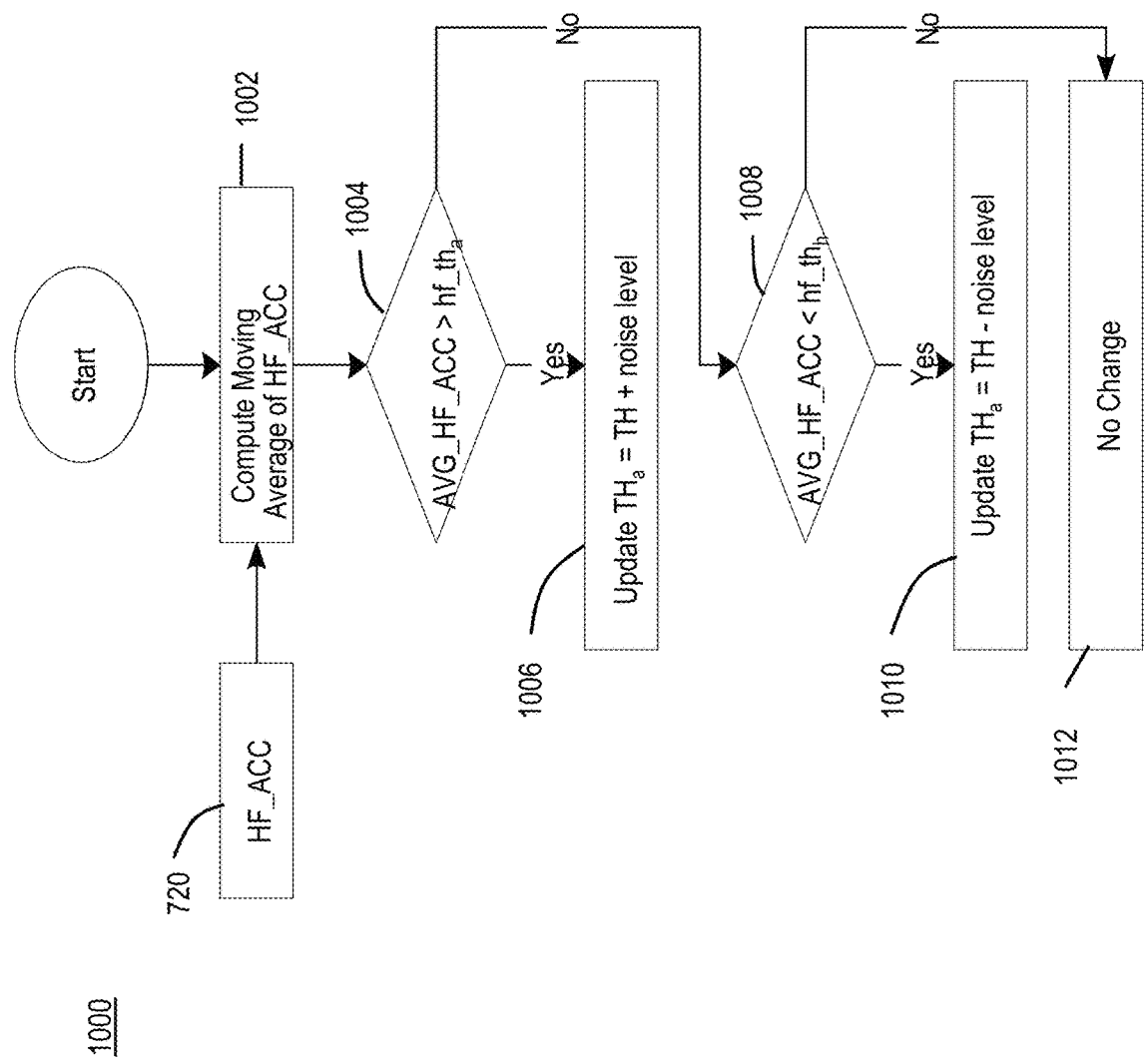
FIG. 10 illustrates a flow diagram of an example process implemented by the arc fault detection system, such as in FIG. 1, by which a spectrum energy threshold, which is used in signal segment processing to detect for arc fault signal content, is adjusted in accordance with an example embodiment of the present disclosure.

FIG. 10 illustrates a flow diagram of an example process 1000 implemented by one or more processing components of the arc fault detection system, such as in FIG. 1, by which a spectrum energy threshold (e.g., $th_a$), which is used in signal segment processing, such as the ARC sub-process, to detect for arc fault signal content, is adjusted in accordance with an example embodiment of the present disclosure. The arc fault detection system computes a moving average over a number of half-cycles (e.g., three or four half-cycles) and checks against a hysteresis threshold for adjustments of threshold $th_a$, which will be used in the next half-cycle to determine binary classification for the arcing word. The process 1000 is described in greater detail below.

For example, at step 1002, the arc fault detection system computes a moving average of the accumulated number of times, e.g., HF_ACC 720, that high frequency signal content was detected in the HF filtered signal spectrum of the signal segments (FIG. 7), over a number of predefined time periods (e.g., over 3 or 4 half-cycles). At step 1002, if the computed moving average is greater than the spectrum energy threshold, e.g., $th_a$, used in the ARC sub-process, then the arc fault detection system updates the spectrum energy threshold $th_a$ to be equal to a threshold plus noise level (TH+noise level) according to a threshold hysteresis curve, such as for example in FIG. 11. The adjusted threshold $th_a$ can be used in future binary classification performed by the ARC sub-process, such as for example in the next predefined time period.

If the computed moving average is not greater than the spectrum energy threshold $th_a$, then the arc fault detection system compares the computed moving average to the spectrum energy threshold $th_h$ used in the HF detection sub-process. If the computed moving average is not less than the spectrum energy threshold $th_h$, then no adjustment is made to the spectrum energy threshold $th_a$ at step 1012. Otherwise, if the computed moving average is less than the spectrum energy threshold $th_h$, then the arc fault detection system updates the spectrum energy threshold $th_a$ to be equal to a threshold minus noise level (TH−noise level) at step 1006 according to a threshold hysteresis curve 1100, such as for example in FIG. 11. The adjusted threshold $th_a$ can be used in future binary classification performed by the ARC sub-process, such as for example in the next predefined time period.

Figure 11:
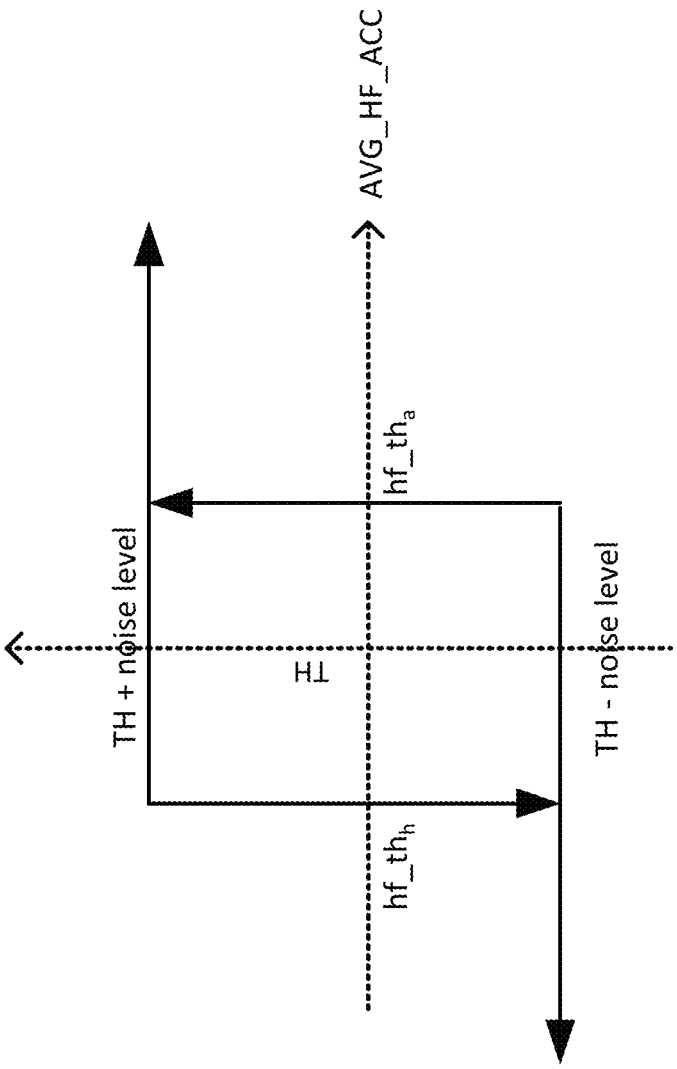
FIG. 11 illustrates a hysteresis curve for a spectrum energy threshold used in signal segment processing to detect for arc fault signal content.

As reflected in the process 1000, the threshold $th_a$ can be a dynamic threshold, which can be dynamically adjusted to increase or decrease the sensitivity for detecting a presence of high frequency components (which may potentially correspond to an arc fault signal) according to noise on the power line system. For example, the moving average of HF_ACC count (e.g., the moving average could be 4 half-cycles to 8 half-cycles of a base frequency) can indicate how busy the half-cycle periods are with high frequency signal content from the power line carriers. If the moving average of the HF_ACC count is very high (e.g., above $hf\_th_a$),there is a lot of high frequency energy in the network, and thus, the spectrum energy threshold $th_a$ is increased by some noise level to desensitize arc fault energy detection. The amount of noise level can be empirically determined. Otherwise, if the moving average of the HF_ACC count is very low (e.g., below $hf\_th_h$), meaning there is very low, or no, power line carriers, then the sensitivity of the arc fault energy detection is increased in the detection system by reducing the spectrum energy threshold $th_a$ by a noise level. The noise level to add or subtract can be performed according to a predefined threshold hysteresis curve 1100, such as shown in FIG. 11.

Figure 12:
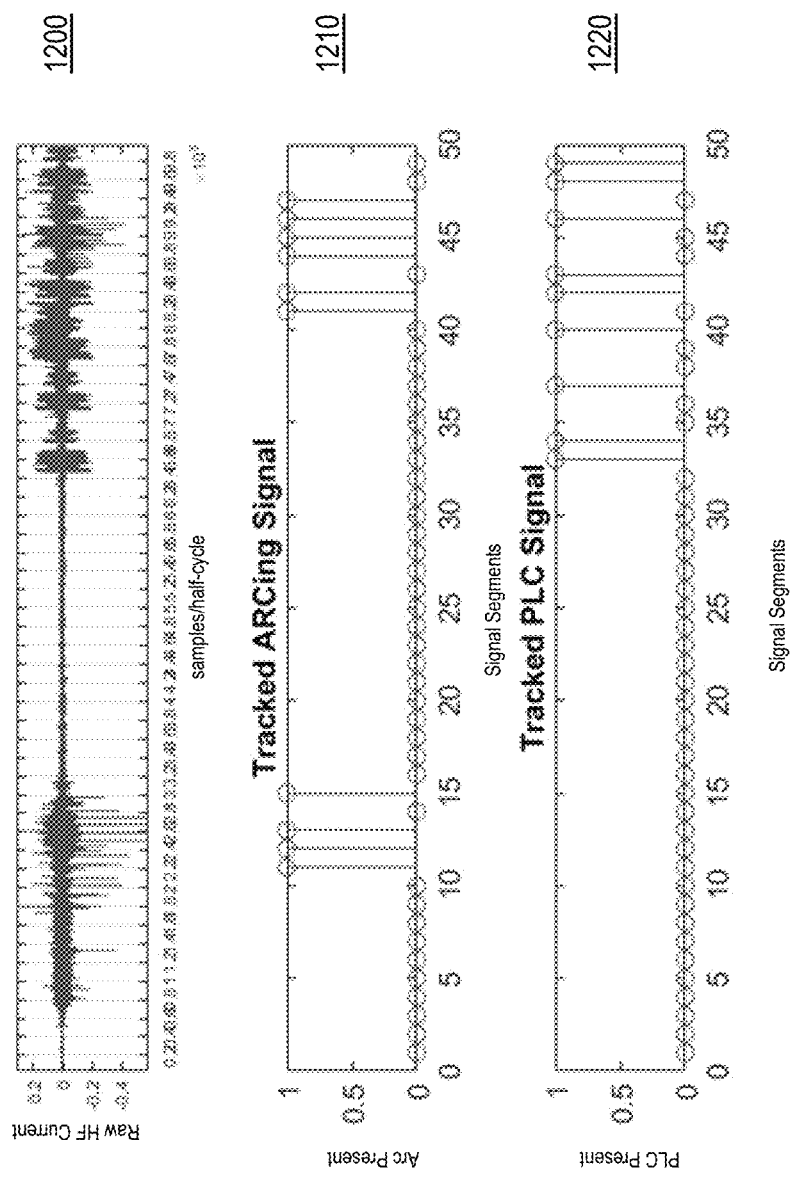
FIG. 12 illustrates three graphs reflecting an example snapshot of an example monitored high frequency signal over a half-cycle of the base frequency with PLC and ARCing signals in which a first graph shows Raw HF Current versus Samples/Half-cycle, a second graph shows Arc Present versus Signal Segments in the half-cycle, and a third graph shows PLC Present versus Signal Segment in the half-cycle.

FIG. 12 illustrates three graphs 1200, 1210 and 1220 reflecting an example snapshot of monitored high frequency signal over a half-cycle with the presence of PLC and ARCing signals based on experimental data. In this example, the predefined time period of the monitored high frequency signal is a half-cycle of a base frequency, and the high frequency signal is partitioned into N-signal segments. As shown in FIG. 12, the first graph 1200 shows raw high frequency (HF) current of the monitored signal versus samples/half-cycle, the second graph 1210 shows arc present (e.g., the presence of potential ARC high frequency signal content) versus signal segments in the half-cycle, and the third graph 1220 shows PLC present (e.g., the presence of PLC high frequency signal content) versus signal segment in the half-cycle. In this example, there are 10 instances in which potential ARC high frequency signal content was detected in the signal segments as shown in the graph 1210, and there are 9 instances in which potential PLC high frequency signal content was detected in the signal segments as shown in the graph 1220. In this example, the arc fault detection system would detect a presence of an arc fault signal, and thus, an arc fault event for the monitored half-cycle.

Figure 13:
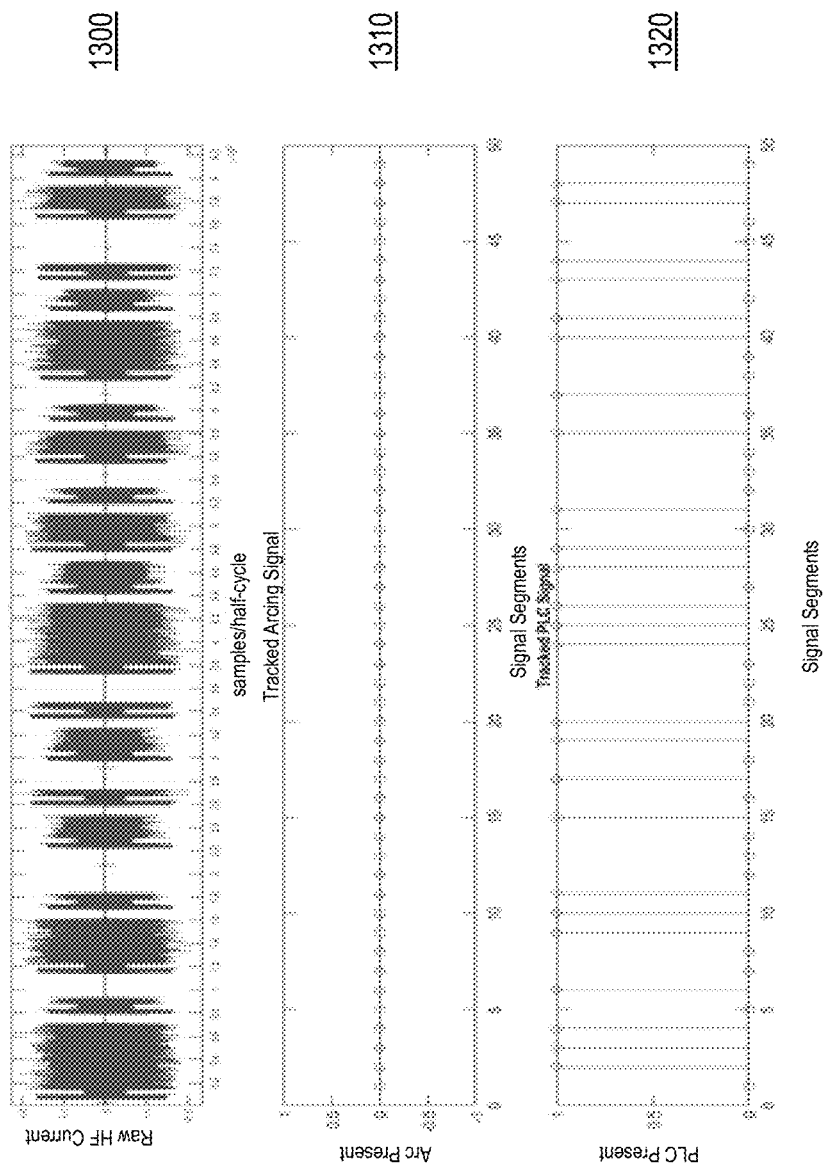
FIG. 13 illustrates three graphs reflecting an example snapshot of an example monitored high frequency signal over a half-cycle of the base frequency with PLC signals but no ARCing signals in which a first graph shows Raw HF Current versus Samples/Half-cycle, a second graph shows Arc Present versus Signal Segments in the half-cycle, and a third graph shows PLC Present versus Signal Segment in the half-cycle.

FIG. 13 illustrates three graphs 1300, 1310, and 1320 reflecting an example snapshot of a monitored high frequency signal over a half-cycle based on experimental data. In this example, the predefined time period of the monitored high frequency signal is a half-cycle of a base frequency, and the high frequency signal is partitioned into N-signal segments. As shown in FIG. 13, the first graph 1300 shows raw high frequency (HF) current of the monitored signal versus samples/half-cycle, the second graph 1310 shows arc present (e.g., the presence of potential ARC high frequency signal content) versus signal segments in the half-cycle, and the third graph 1320 shows PLC present (e.g., the presence of PLC high frequency signal content) versus signal segment in the half-cycle. In this example, there are 0 instances in which potential ARC high frequency signal content was detected in the signal segments as shown in the graph 1310, and there are 25 instances in which potential PLC high frequency signal content was detected in the signal segments as shown in the graph 1320. In this example, the arc fault detection system would detect an absence of arc fault signal, and thus, no arc fault for the monitored half-cycle It should also be understood that the example embodiments disclosed and taught herein are susceptible to numerous and various modifications and alternative forms. Thus, the use of a singular term, such as, but not limited to, "a" and the like, is not intended as limiting of the number of items. Furthermore, the naming conventions for the various components, functions, thresholds, masks and other elements used herein are provided as examples, and can be given a different name or label.

It will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

Using the description provided herein, the example embodiments may be implemented as a machine, process, or article of manufacture by using standard programming and/or engineering techniques to produce programming software, firmware, hardware or any combination thereof.

Any resulting program(s), having computer-readable program code, may be embodied on one or more computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable medium or in any transmitting medium which transmits such a program.

A processor(s) or controller(s) as described herein can be a processing system, which can include one or more processors, such as CPU, GPU, controller, FPGA (Field Programmable Gate Array), ASIC (Application-Specific Integrated Circuit) or other dedicated circuitry or other processing unit, which controls the operations of the devices or systems, described herein. Memory/storage devices can include, but are not limited to, disks, solid state drives, optical disks, removable memory devices such as smart cards, SIMs, WIMs, semiconductor memories such as RAM, ROM, PROMS, etc. Transmitting mediums or networks include, but are not limited to, transmission via wireless communication (e.g., Radio Frequency (RF) communication, Bluetooth®, Wi-Fi, Li-Fi, etc.), the Internet, intranets, telephone/modem-based network communication, hardwired/cabled communication network, satellite communication, and other stationary or mobile network systems/communication links.

Furthermore, the detection features and functions can be implemented in a circuit breaker, or across separate component(s) or module(s), which can communicate and interact with a circuit breaker or other power interruption device to facilitate interruption of power (e.g., current or voltage) on a power line of a circuit when an arc fault is detected. For example, the signal segment processing, as described herein, can be implemented in the same processor or a separate processor (e.g., a separate ASIC or FPGA).

In addition, the signal spectrum for the high frequency signal or segments thereof can be generated using a Fourier Transform (e.g., discrete Fourier Transform), Cosine Transform (e.g., discrete Cosine Transform), or other suitable mathematical transforms. The predefined time period can be a half-cycle of a base frequency, a full-cycle of a base frequency or any number of half-cycles.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention as defined in the appended claims.

The invention claimed is:

1. A method of detecting an arc fault signal from a high frequency signal on a power line, comprising:
   monitoring a high frequency signal on a power line over a first predefined time period;
   partitioning the high frequency signal into a plurality of time-segmented signal segments, each signal segment being a smaller time interval of the first predefined time period;
   for each signal segment, applying a first filter to a signal spectrum of the signal segment to produce a first filtered signal spectrum with one or more frequency intervals associated with power line communication filtered from the signal spectrum, checking for high frequency signal content in the first filtered signal spectrum of the signal segment, and assigning a first binary value to the signal segment based upon a presence or absence of high frequency signal content in the first filtered signal spectrum;
   determining whether the high frequency signal includes an arc fault signal based on the first binary values of the plurality of signal segments in the first predefined time period; and
   causing power to be interrupted on the power line when an arc fault signal is determined.

2. The method of claim 1, wherein, for each signal segment, the assigning a first binary value comprises:
   determining a relative magnitude of energy of the first filtered signal spectrum of the signal segment;
   comparing the relative magnitude of energy to a first spectrum energy threshold for determining a presence or absence of high frequency signal content in the signal segment; and
   assigning the first binary value to the signal segment based on the comparison.

3. The method of claim 2, further comprising:
   for each signal segment, applying a second filter, which is an inverse filter of the first filter, to a signal spectrum of the signal segment to produce a second filtered signal spectrum with one or more frequency intervals associated with power line communication, checking for high frequency signal content in the second filtered signal spectrum of the signal segment, and assigning a second binary value to the signal segment based upon a presence or absence of high frequency signal content in the second filtered signal spectrum of the signal segment; and
   adjusting the first spectrum energy threshold based on the second binary values of the plurality of signal segments in the first period,
   wherein the adjusted first spectrum energy threshold is used to evaluate high frequency signal on the power line in a time period after the first predefined time period.

4. The method of claim 3, wherein, for each signal segment, the assigning a second binary value comprises:
   determining a relative magnitude of energy of the second filtered signal spectrum of the signal segment;
   comparing the relative magnitude of energy of the second filtered signal spectrum to a second spectrum energy threshold for determining a presence or absence of high frequency signal content in the signal segment; and
   assigning the second binary value to the signal segment based on the comparison.

5. The method of claim 1, wherein the determining whether the high frequency signal includes an arc fault signal, comprises:
   counting a number of times that high frequency signal content is present over the predefined time period based on the first binary values;
   comparing the number of times that high frequency signal content is present over the predefined time period to at least a first high frequency threshold; and
   detecting an arc fault signal when a condition for the first high frequency threshold is satisfied.

6. The method of claim 5, wherein the first high frequency threshold is associated with load on the power line and a second high frequency threshold is associated with arcing on the power line, the determining whether the high frequency signal includes an arc fault signal further comprising:
   when the first high frequency threshold is satisfied, comparing the number of times that high frequency signal content is present over the predefined time period to the second high frequency threshold,
   wherein an arc fault signal is detected when both conditions for the first and second high frequency thresholds are satisfied.

7. The method of claim 5, further comprising:
   generating a binary word from a sequence of the first binary values for the signal segments from the first predefined time period,
   wherein the determining further comprises: when the first high frequency threshold is not satisfied, evaluating the binary word to detect for an occurrence of an arc fault signal.

8. The method of claim 7, wherein the evaluating comprises:
   comparing the binary word to one or more predefined word patterns to detect for an occurrence or non-occurrence of an arc fault signal in the high frequency signal, the one or more predefined word patterns reflecting a predefined arc fault event or non-arc fault event.

9. The method of claim 1, wherein the predefined time period is a half-cycle of a base frequency, the signal spectrum for each signal segment is generated using a Fourier Transform or a Cosine Transform, and the monitoring, partitioning, applying, checking, assigning and determining operations are performed in a circuit breaker.

10. The method of claim 1, further comprising:
    storing the assigned first binary value for each signal segment,
    wherein whether the high frequency signal includes an arc fault signal is determined based on the stored first binary values of the plurality of signal segments in the first predefined time period.

11. The method of claim 1, further comprising:
    repeating the operations of monitoring, partitioning, applying and determining over a next first predefined time period,
    wherein power is caused to be interrupted on the power line when an arc fault signal is determined from the plurality of signal segments in the next first predefined time period.

12. An arc fault detection device for detecting an arc fault signal from a high frequency signal on a power line, comprising:
    a memory; and
    one or more processors configured to:
       monitor a high frequency signal on a power line over a first predefined time period, partition the high frequency signal into a plurality of time-segmented signal segments, each signal segment being a smaller time interval of the first predefined time period, for each signal segment, apply a first filter to a signal spectrum of the signal segment to produce a first filtered signal spectrum with one or more frequency intervals associated with power line communication filtered from the signal spectrum, check for high frequency signal content in the first filtered signal spectrum of the signal segment, and assign a first binary value to the signal segment based upon a presence or absence of high frequency signal content in the first filtered signal spectrum, determine whether the high frequency signal includes an arc fault signal based on the first binary values of the plurality of signal segments in the first predefined time period, and cause power to be interrupted on the power line when an arc fault signal is determined.

13. The arc fault detection device of claim 12, wherein, for each signal segment, to assign a binary value, the one or more processors are configured to:

determine a relative magnitude of energy of the first filtered signal spectrum of the signal segment;

compare the relative magnitude of energy to a first spectrum energy threshold for determining a presence or absence of high frequency signal content in the signal segment; and assign the first binary value to the signal segment based on the comparison.

14. The arc fault detection device of claim 13, wherein the one or more processors are further configured to for each signal segment, apply a second filter, which is an inverse filter of the first filter, to a signal spectrum of the signal segment to produce a second filtered signal spectrum with one or more frequency intervals associated with power line communication, check for high frequency signal content in the second filtered signal spectrum of the signal segment, and assign a second binary value to the signal segment based upon a presence or absence of high frequency signal content in the second filtered signal spectrum of the signal segment; and adjust the first spectrum energy threshold based on the second binary values of the plurality of signal segments in the first predefined time period, wherein the adjusted first spectrum energy threshold is used to evaluate high frequency signal on the power line in a time period after the first predefined time period.

15. The arc fault detection device of claim 14, wherein, for each signal segment, to assign a second binary value, the one or more processors are configured to:

determine a relative magnitude of energy of the second filtered signal spectrum of the signal segment;

compare the relative magnitude of energy of the second filtered signal spectrum to a second spectrum energy threshold for determining a presence or absence of high frequency signal content in the signal segment; and assign the second binary value to the signal segment based on the comparison.

16. The arc fault detection device of claim 12, wherein, to determine whether the high frequency signal includes an arc fault signal, the one or more processors are configured to:

count a number of times that high frequency signal content is present over the predefined time period based on the first binary values;

compare the number of times that high frequency signal content is present over the predefined time period to at least a first high frequency threshold; and detect an arc fault signal when the first high frequency threshold is satisfied.

17. The arc fault detection device of claim 16, wherein the first high frequency threshold is associated with load on the power line and a second high frequency threshold is associated with arcing on the power line, to determine whether the high frequency signal includes an arc fault signal, the one or more processors being further configured to:

when the first high frequency threshold is satisfied, compare the number of times that high frequency signal content is present over the predefined time period to the second high frequency threshold, wherein the one or more processors detect an arc fault signal when both conditions for the first and second high frequency thresholds are satisfied.

18. The arc fault detection device of claim 16, the one or more processors further configured to:

generate a binary word from a sequence of the first binary values for the signal segments from the first predefined time period, wherein, to determine whether the high frequency signal includes an arc fault signal, the one or more processors are further configured to:

when the first high frequency threshold is not satisfied, evaluate the binary word to detect for an occurrence of an arc fault signal.

19. The arc fault detection device of claim 18, wherein to evaluate the binary word, the one or more processors are configured to:

compare the binary word to one or more predefined word patterns to detect for an occurrence or non-occurrence of an arc fault signal in the high frequency signal, the one or more predefined word patterns reflecting a predefined arc fault event or non-arc fault event.

20. A tangible computer medium storing computer executable code, which when executed, is configured to implement a method of detecting an arc fault signal from a high frequency signal on a power line, the method comprising:

monitoring a high frequency signal on a power line over a first predefined time period;

partitioning the high frequency signal into a plurality of time-segmented signal segments, each signal segment being a smaller time interval of the first predefined time period;

for each signal segment, applying a first filter to a signal spectrum of the signal segment to produce a first filtered signal spectrum with one or more frequency intervals associated with power line communication filtered from the signal spectrum, checking for high frequency signal content in the first filtered signal spectrum of the signal segment, and assigning a first binary value to the signal segment based upon a presence or absence of high frequency signal content in the first filtered signal spectrum;

determining whether the high frequency signal includes an arc fault signal based on the first binary values of the plurality of signal segments in the first predefined time period; and cause power to be interrupted on the power line when an arc fault signal is determined.

\* \* \* \* \*